United States Patent
Ihara

(10) Patent No.: US 8,784,118 B2
(45) Date of Patent: Jul. 22, 2014

(54) CONNECTION TERMINAL STRUCTURE, METHOD FOR MANUFACTURING CONNECTION TERMINAL STRUCTURE, AND CONNECTION TERMINAL STRUCTURE SUBSTRATE

(75) Inventor: Yoshihiro Ihara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 94 days.

(21) Appl. No.: 13/554,080

(22) Filed: Jul. 20, 2012

(65) Prior Publication Data
US 2013/0029538 A1    Jan. 31, 2013

(30) Foreign Application Priority Data

Jul. 26, 2011 (JP) .................................. 2011-162909

(51) Int. Cl.
*H01R 12/00* (2006.01)
*H05K 7/10* (2006.01)
*H01R 13/24* (2006.01)

(52) U.S. Cl.
CPC .......... *H01R 13/2442* (2013.01); *H05K 7/1069* (2013.01)
USPC .............................................. 439/66; 439/71

(58) Field of Classification Search
CPC ...... H01R 23/722; H01R 12/57; H01R 13/24; H01R 9/096; H01R 12/707; H01R 12/7076; H01R 24/50; H01R 43/2056

USPC .................................. 439/66, 71, 81, 83, 591
See application file for complete search history.

(56) References Cited

U.S. PATENT DOCUMENTS

| | | | |
|---|---|---|---|
| 6,939,143 B2 * | 9/2005 | Rathburn | 439/66 |
| 7,048,548 B2 * | 5/2006 | Mathieu et al. | 439/66 |
| 7,458,816 B1 * | 12/2008 | Mathieu et al. | 439/66 |
| 7,628,617 B2 * | 12/2009 | Brown et al. | 439/66 |
| 7,748,991 B2 * | 7/2010 | Nikaido et al. | 439/71 |
| 7,773,388 B2 * | 8/2010 | Kariya et al. | 361/776 |
| 7,891,984 B1 * | 2/2011 | Ju | 439/66 |
| 8,215,966 B2 * | 7/2012 | Champion et al. | 439/66 |
| 8,313,332 B2 * | 11/2012 | Daniel et al. | 439/66 |
| 8,382,487 B2 * | 2/2013 | Jeon et al. | 439/66 |

FOREIGN PATENT DOCUMENTS

JP       2001-143829       5/2001

* cited by examiner

*Primary Examiner* — Thanh Tam Le
(74) *Attorney, Agent, or Firm* — IPUSA, PLLC

(57) ABSTRACT

A connection terminal structure includes a support member including a first surface and an opening part formed in the first surface, and at least one connection terminal formed on the first surface, the connection terminal including a fixing part, a connection part configured to connect to a connection object, and a spring part communicating between the fixing part and the connection part. The spring part and the connection part are bent upward together with the support member and project toward the connection object. A portion of the fixing part is exposed in the opening part.

5 Claims, 9 Drawing Sheets

CONNECTION TERMINAL STRUCTURE, METHOD FOR MANUFACTURING CONNECTION TERMINAL STRUCTURE, AND CONNECTION TERMINAL STRUCTURE SUBSTRATE

CROSS-REFERENCE TO RELATED APPLICATIONS

This application is based upon and claims the benefit of priority of the prior Japanese Patent Application No. 2011-162909 filed on Jul. 26, 2011, the entire contents of which are incorporated herein by reference.

FIELD

The embodiments discussed herein are related to, for example, a connection terminal structure including a connection terminal provided on a support member, a method for manufacturing the connection terminal structure, and a connection terminal structure substrate including the connection terminal structure.

BACKGROUND

Conventionally, a socket, which electrically connects a first connection object (e.g., semiconductor package) and a second connection object (e.g., mounting substrate), is known.

One example of such socket is a socket for mounting a package on a substrate. In this example, a group of terminal electrodes (terminal electrode group) is arranged in a desired pattern on the package, and a group of electrodes (electrode group) is formed on the substrate. The socket includes a flexible wiring board, a socket body on which the flexible wiring board is mounted, and a cover that presses the package toward the socket body. The flexible wiring board includes a first group of electrodes (first electrode group) to be connected to the terminal electrode group of the package, and a second group of electrodes (second electrode group) to be connected to the electrode group of the substrate.

In this socket, the flexible wiring board has plural uplifting pieces projecting toward a side of one surface of the flexible wiring board. Each electrode of the first electrode group is provided on a surface of a corresponding one of the plural uplifting pieces. The flexible wiring board has the second electrode group provided on the other surface of the flexible wiring board (see, for example, Japanese Laid-Open Patent Publication No. 2001-143829).

However, this socket requires a complex manufacturing process using an intricate die because the uplifting pieces serving as connection terminals are bent in a U-shape.

SUMMARY

According to an aspect of the invention, there is provided a connection terminal structure including: a support member including a first surface and an opening part formed in the first surface; and at least one connection terminal formed on the first surface, the connection terminal including a fixing part, a connection part configured to connect to a connection object, and a spring part communicating between the fixing part and the connection part; wherein the spring part and the connection part are bent upward together with the support member and project toward the connection object; wherein a portion of the fixing part is exposed in the opening part.

The object and advantages of the invention will be realized and attained by means of the elements and combinations particularly pointed out in the claims.

It is to be understood that both the foregoing generation description and the followed detailed description are exemplary and explanatory and are not restrictive of the invention, as claimed.

DESCRIPTION OF EMBODIMENTS

In the following, embodiments of the present invention are described with reference to the accompanying drawings.

First Embodiment

Connection Terminal Structure of First Embodiment

Figure 1A:
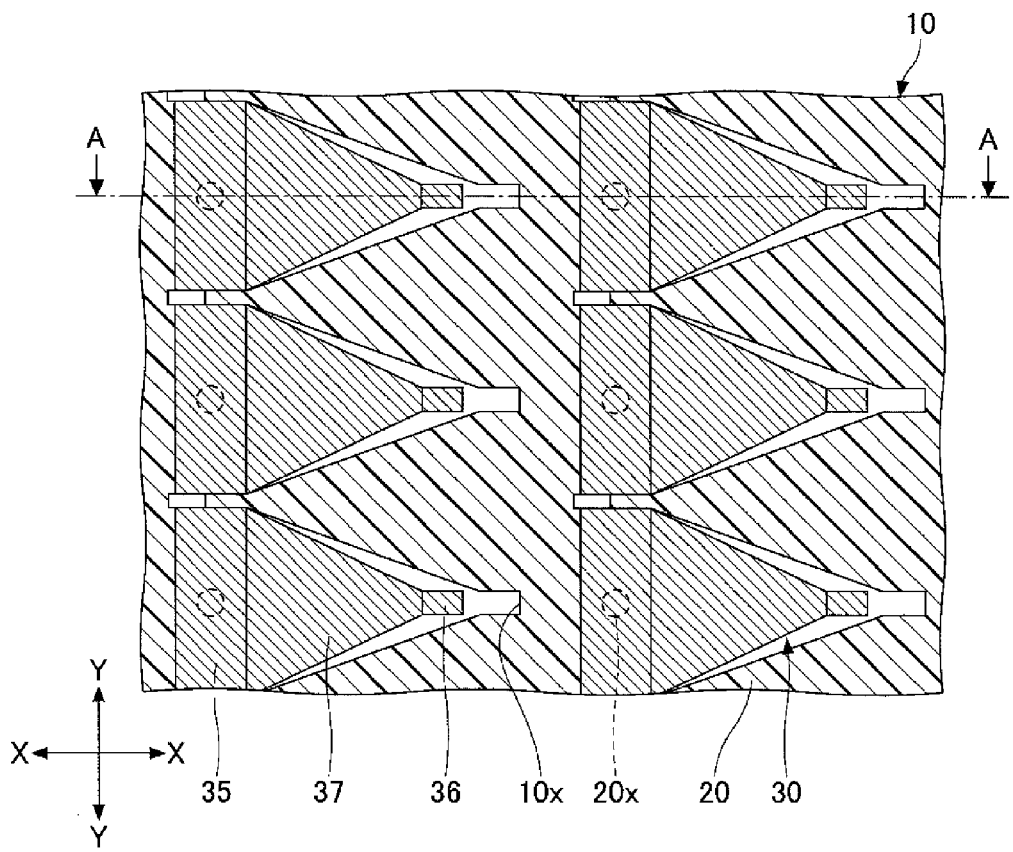
FIG. 1A is a plan view of a connection terminal structure according to a first embodiment of the present invention.
Figure 1B:
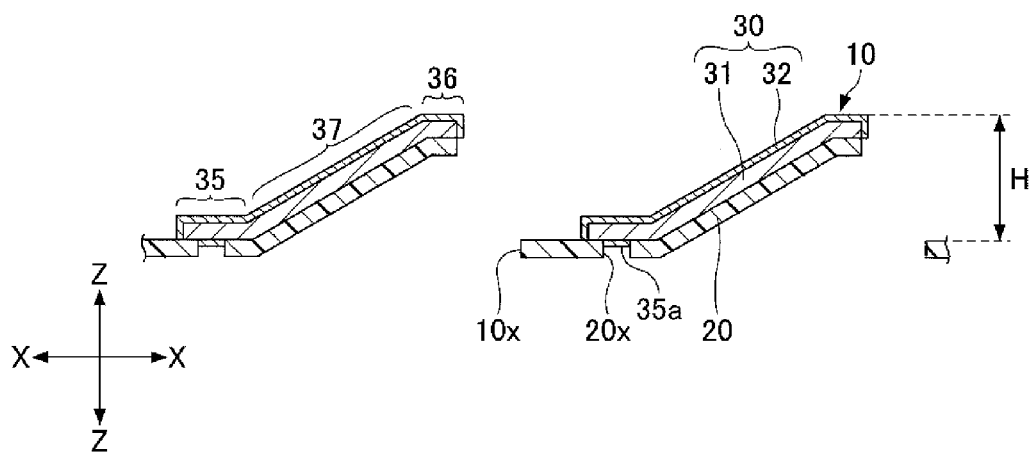
FIG. 1B is a cross-sectional view of the connection terminal structure taken along line A-A of FIG. 1A.
Figure 2:
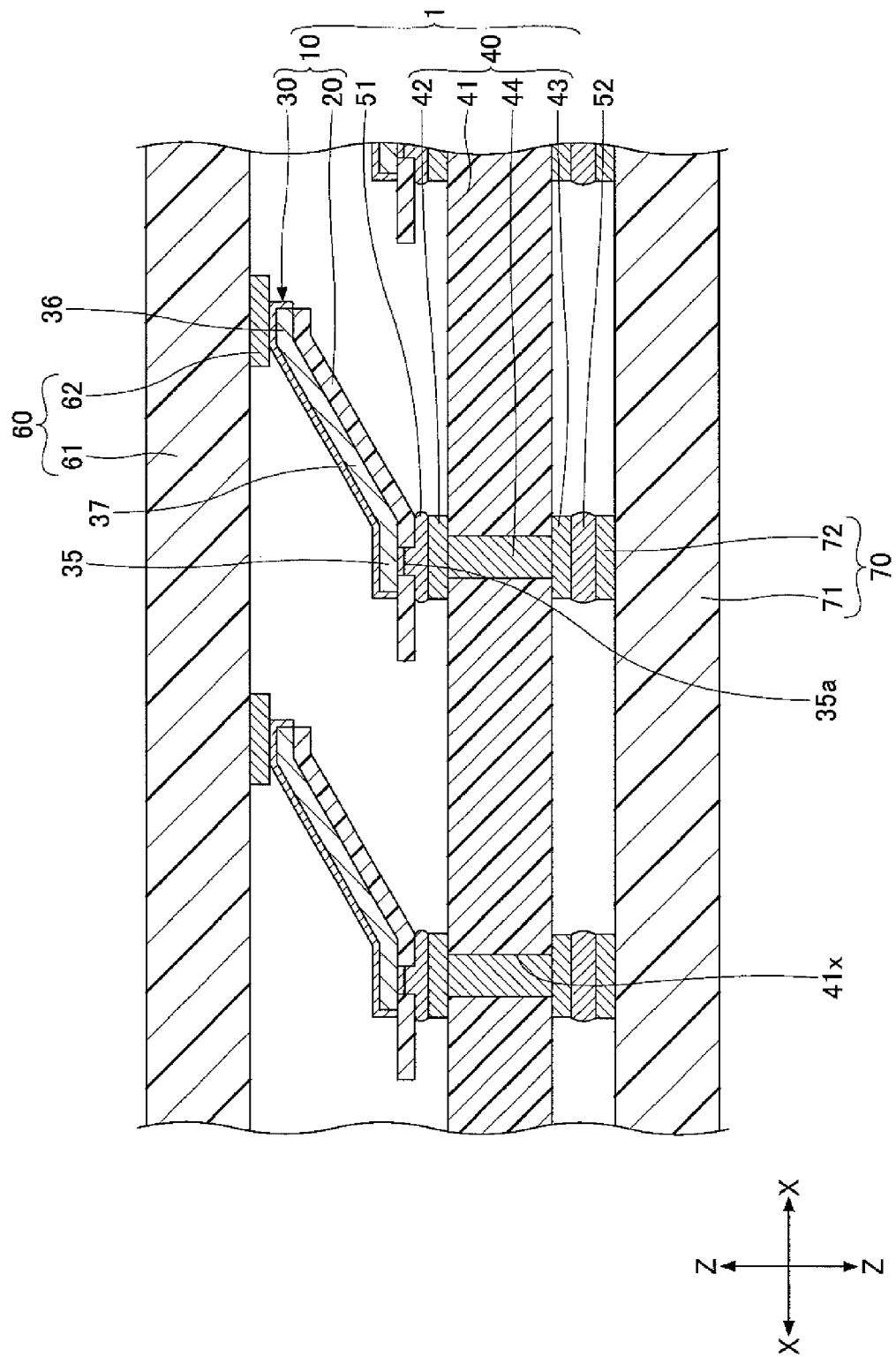
FIG. 2 is a cross-sectional view of a substrate including a connection terminal structure according to the first embodiment of the present invention.

FIGS. 1A and 1B are schematic diagrams for describing an example of a connection terminal structure 10 according to the first embodiment of the present invention. FIG. 1A is a plan view of the connection terminal structure 10 according to the first embodiment of the present invention. FIG. 1B is a cross-sectional view of the connection terminal structure 10 taken along line A-A of FIG. 1A. FIG. 2 is a cross-sectional view of a connection terminal structure substrate 1 including the connection terminal structure 10 according to the first embodiment of the present invention. The connection terminal structure substrate 1 including the connection terminal structure 10 may also be hereinafter referred to as a "structure mounted substrate 1".

With reference to FIGS. 1A, 1B, and 2, the structure mounted substrate 1 includes the connection terminal structure 10, a substrate 40, and a bonding part 51. In FIG. 2, reference numeral 52 represents a bonding part, reference numeral 60 indicates a first connection object, and reference numeral 70 indicates a second connection object. The first connection object 60 is electrically connected to the second connection object 70 by way of the structure mounted substrate 1.

The first connection object 60 may be, for example, a semiconductor package (e.g., Land Grid Array (LGA)) or a wiring substrate having no semiconductor chip. The first connection object 60 includes a substrate 61, and a pad 62 formed on a surface of the substrate 61. The second connection object 70 may be, for example, a mounting substrate (e.g., motherboard). The second connection object 70 includes a substrate 71 and a pad 72 formed on a surface of the substrate 71.

The connection terminal structure 10 includes a support member 20 and plural connection terminals 30. The support member 20 secures the positions of the plural connection terminals 30. A member having a rectangular shape from a plan view may be used as the support member 20. The plan view shape of the support member 20 is not limited to a rectangle but also other shapes.

For example, a film formed of an insulating resin (e.g., a polyimide type resin) may be used as the material of the support member 20. Alternatively, other insulating resins such as an aramid type resin or an epoxy type resin may be used instead of the polyimide type resin. Alternatively, a member formed by impregnating a glass cloth with an insulating resin (e.g., an epoxy type resin) may be used instead of the polyimide type resin. The thickness of the support member 20 may be, for example, approximately 25 µm to 100 µm.

The connection terminals 30 may be arranged, for example, on a first surface of the support member 20 in a grid pattern, so that the below-described connection part 36 of the connection terminal 30 is in a position corresponding to the position of the pad 62 of the first connection object 60. The pitch between the connection terminals 30 (pitch between the connection parts 36) may be, for example, approximately 0.3 mm to 1.0 mm. The connection terminal 30 includes a metal part 31 and a plating part 32. The connection terminal 30 and a part of the support member 20 are formed (bent) into a predetermined shape. The metal part 31 is bonded to the first surface of the support member 20. The plating part 32 is formed on a surface of the metal part 31 (including a portion exposed in the below-described opening part 20x). The metal part 31 may be bonded to the first surface of the support member 20 by an adhesive layer (not illustrated). Further, the metal part 31 may be bonded to the first surface of the support member 20, for example, by pressure welding.

For example, copper (Cu), a copper alloy (e.g., phosphor bronze, beryllium copper, Corson type copper alloy) may be used as the material of the metal part 31. The thickness of the metal part 31 may be, for example, approximately 25 µm to 100 µm. For example, a nickel cobalt (NiCo) alloy plating may be used as the material of the plating part 32. Alternatively, a palladium cobalt (PdCo) alloy plating or a nickel (Ni) plating may be used instead of nickel cobalt.

In a case where a nickel cobalt (NiCo) alloy plating or a palladium cobalt (PdCo) alloy plating is used as the plating part 32, the thickness of the plating part 32 may be, for example, approximately 10 µm to 50 µm. In a case where a nickel (Ni) plating is used as the plating part 32, the thickness of the plating part 32 may be, for example, approximately 20 µm to 100 µm. The plating part 32 can easily attain a resilient property because the nickel cobalt (NiCo) alloy plating, the palladium cobalt (PdCo) alloy plating, and the nickel (Ni) plating are extremely rigid.

In order to increase the connecting reliability to the pad 62 of the first connection object 60, a noble metal plating (e.g., a gold (Au) plating, a palladium (Pd) plating) may be formed on the surface of the plating part 32 formed of, for example, a nickel cobalt (NiCo) alloy plating. The thickness of the noble metal plating (e.g., a gold (Au) plating) may be, for example, approximately 0.1 µm to 0.4 mm. The noble metal plating (e.g., a gold (Au) plating) may be solely formed on a portion of the plating part 32 corresponding to the connection part 36.

The connection terminal 30 is formed of a conductive material that can achieve elastic deformation (elastic property). The connection terminal 30 has a fixing part 35 provided on one end of the connection terminal 30, the connection part 36 provided on the other end of the connection terminal 30, and a spring part 37 communicating between the fixing part 35 and the connection part 36. The fixing part 35 and the connection part 36 have a substantially rectangular shape from a plan view, respectively. The fixing part 35, the connection part 36, and the spring part 37 form a united body (i.e. integrally formed). The fixing part 35 is electrically connected to the connection part 36 by way of the spring part 37.

As illustrated in FIG. 1A, the width of the fixing part 35 (Y-Y direction) is greater than the width of the connection part 36 (Y-Y direction). The spring part 37 has a shape that becomes wider toward one end of the spring part 37 from the side of the connection part 36 to the side of the fixing part 35 (substantially triangular shape). In a case where the fixing part 35 is fixed to, for example, the substrate 40 and a pressing force is exerted onto the connection part 36, the pressing force can be evenly distributed owing to the shape of the spring part 37 becoming wider toward its end. It is, however, to be noted that the shapes of the fixing part 35, the connection part 36, and the spring part 37 are not limited to those illustrated in FIG. 1A.

A portion of the fixing part 35 is exposed in the opening part 20x formed in the support member 20. The portion exposed in the opening part 20x of the fixing part 35 functions as a pad when bonding the connection terminal structure 10 to the substrate 40. The portion exposed in the opening part 20x of the fixing part 35 may also be hereinafter referred to as "pad 35a". The pad 35a has a shape of, for example, a circle from a plan view. The diameter of the circle-shaped pad 35a may be, for example, approximately 50 µm to 200 µm.

The spring part 37 and the connection part 36, which are bent upward together with the support member 20, project in a direction of the first surface of the support member 20 (i.e. project toward the first connection object 60 as illustrated in, for example, FIG. 2). The connection part 36 is a part of the connection terminal 30 that contacts the pad 62 of the first connection object 60. A portion of the connection terminal 30 at which the plating part 32 is formed contacts the pad 62 of the first connection object 60.

The connection part 36 is not limited to a flat shape. For example, the connection part 36 may have a convex shape (e.g., rounded shape) having a surface projecting toward the pad 62 of the first connection object 60. In a case where the connection part 36 has a rounded shape, the pad 62 of the first connection object 60 can be prevented from being damaged by the connection part 36 when exerting a pressing force onto the connection part 36 in a direction toward the substrate 40.

The spring part 37 is inclined a predetermined angle relative to the fixing part 35. The spring part 37 has an elastic property. The spring part 37 is not limited to a flat shape. For example, the spring part 37 may have an arcuate shape having a surface projecting toward the substrate 40. In a case where a pressing force is exerted from the first connection object 60 onto the connection part 36, the spring part 37 causes the connection part 36 to exert a repulsive force onto the pad 62. Thus, the spring part 37 provides a function of the connection part 36 and the pad 62 contacting without having to attach (fix) the connection part 36 and the pad 62 together.

In the connection terminal 30 according to this embodiment, the connection part 36 and the spring part 37 together provide a function of a spring having a united body. The spring constant of the portion of the connection terminal 30 functioning as a spring (i.e. the connection part 36 and the spring part 37) may have a spring constant of, for example, approximately 0.6 N/mm to 0.8 N/mm. In a case where no pressing force is exerted onto the connection part 36 of the connection terminal 30 as illustrated in FIG. 1B, the height H of the connection part 30 may be, for example, approximately 0.2 mm to 0.8 mm. The movable range of the connection terminal 30 may be, for example, approximately 0.1 mm to 0.3 mm.

As described in the following manufacturing process of the connection terminal structure 10, each connection terminal 30 is manufactured by performing processes including a cutting process and an upward-bending process on the support member 20 together with a portion corresponding to the spring part 37 and the connection part 36. Therefore, the opening part 10x is formed in the support member 20 after the connection terminal 30 is manufactured.

In this embodiment, the structure mounted substrate 1 is formed by bonding the connection terminal structure 10 to the substrate 40 by the bonding part 51. The substrate 40 includes a substrate body 41 having first and second substrate surfaces, a first conductive layer 42 formed on the first substrate surface, a second conductive layer 43 formed on the second substrate surface, and a via wiring 44 formed inside a through-hole 41x penetrating the substrate body 41 from the first substrate surface of the substrate body 41 to the second substrate surface of the substrate body 41. Further, a solder resist layer including an opening part exposing a portion of the first conductive layer 42 may be formed on the first substrate surface of the substrate body 41. Further, another solder resist layer including another opening part exposing a portion of the second conductive layer 43 may be formed on the second substrate surface of the substrate body 41.

The first conductive layer 42 is electrically connected to the second conductive layer 43 interposed by the via wiring 44. The through hole 41x need not to be entirely filled with the via wiring 44 as long as the first and the second conductive layers 42, 43 are connected by the via wiring 44. The first conductive layer 42 functions as a pad to be connected to the fixing part 35 of the connection terminal 30. The second conductive layer 43 functions as a pad to be connected to the pad 72 of the second connection object 70. The pitch between the first conductive layers (i.e. pads) 42 may be, for example, approximately 0.3 mm to 1.0 mm.

The substrate body 41 is for fixing the connection terminal structure 10 thereon. For example, a flexible film-like substrate including polyimide resin or a liquid crystal polymer may be used as the substrate body 41. Alternatively, a rigid substrate (e.g., FR-4 material) formed by impregnating a glass cloth with an insulating resin (e.g., epoxy type resin) may be used as the substrate body 41. The thickness of the substrate body 41 may be, for example, approximately 100 μm to 800 μm.

For example, copper (Cu) may be used as the material of the first conductive layer 42, the second conductive layer 43, and the via wiring 44. The thickness of the first and the second conductive layers 42, 43 may be, for example, approximately 5 μm to 50 μm. For example, the first conductive layer 42, the second conductive layer 43, and the via wiring 44 may be formed by using various wiring forming methods such as a semi-additive method or a subtractive method.

In the configuration illustrated in FIG. 2, the first and the second conductive layers 42, 43 are positioned superposing each other from a plan view. Alternatively, a wiring pattern may be formed on the first or the second surface of the substrate body 41, so that the second conductive layer 43 can be moved to a given position that does not superpose with the first conductive layer 42 from a plan view. Thereby, the second conductive layers (pads) 43 can be arranged with a pitch that is different from the pitch between the first conductive layers (pads) 42. In other words, pitch conversion can be achieved by using the substrate 40. The pitch conversion can also be performed in a case where a multilayer wiring substrate is used as the substrate 40.

The pad 35a of the connection terminal 30 is bonded to the first conductive layer 42 interposed by the bonding part 51. Thereby, the pad 35a is electrically and mechanically connected to the first conductive layer 42. The connection part 36 of the connection terminal 30 contacts the pad 62 in a separable state from the pad 62 (i.e. a state where the connection part 36 is not fixed to the pad 62). Thereby, the connection part 36 is electrically connected to the pad 62.

The bonding part 51, which is formed on the first conductive layer 42, electrically and mechanically connects the pad 35a of the connection terminal 30 and the first conductive layer 42. The bonding part 52 electrically and mechanically connects the second conductive layer 43 of the substrate 40 and the pad 72 of the second connection object 70. For example, a conductive material such as solder or a conductive resin paste (e.g., silver (Ag) paste) may be used as the material of the bonding parts 51, 52. In a case where a solder is used as the material of the bonding part 51, an alloy such as an alloy including lead (Pb), the solder may be, for example, an alloy including tin (Sn) and copper (Cu), an alloy including tin (Sn) and silver (Ag), or an alloy including tin (Sn), silver (Ag), and copper (Cu).

The first connection object 60 and the structure mounted substrate 1 bonded to the second connection object 70 are positioned by a frame part (not illustrated), so that the pad 62 of the first connection object 60 and the connection part 36 of the connection terminal 30 contact each other. For example, the frame part may have a frame-like shape from a plan view. Further, the position of the first connection object 60 is fixed (locked) by a lid part (not illustrated) in a state where a pressing force is exerted toward the substrate 40 by the lid part onto the first connection object 60.

Thereby, the pressing force exerted onto the first connection object 60 is transmitted to the connection terminal 30. The pressing force transmitted to the connection terminal 30 causes the connection terminal 30 to contract in the Z-Z direction and generate a predetermined amount of spring force. Accordingly, the pad 62 of the first connection object 60 contacts the connection part 36 of the connection terminal 30. In other words, the first connection object 60 is electrically connected to the second connection object 70 by the structure mounted substrate 1. By locking and unlocking (releasing) the lid part (not illustrated), the first connection object 60 can be detachably attached to the structure mounted substrate 1 and the second connection object 70.

Accordingly, the above-described embodiment of the structure mounted substrate 1 and the frame part (not illustrated) and the lid part (not illustrated) constitute a socket of a semiconductor package. By changing the thickness of the substrate 40, the height of the socket can be easily adjusted.

[Method for Manufacturing Connection Terminal Structure of First Embodiment]

Next, a method for manufacturing the connection terminal structure 10 according to the first embodiment of the present invention is described. FIGS. 3A-8B are schematic diagrams for describing processes performed in the method for manufacturing the connection terminal structure 10 according to the first embodiment of the present invention. FIGS. 3A, 4A, 5A, 6A, 7A, and BA are bottom views. FIGS. 3B, 4B, 5B, 6B, 7B, and 8B are cross-sectional views taken along line A-A of corresponding FIGS. 3A, 4A, 5A, 6A, 7A, and 8A. In FIGS. 3A, 4A, 5A, 6A, 7A, and 8A, the same hatchings are used for illustrating corresponding parts/areas in FIGS. 3B, 4B, 5B, 6B, 7B, and 8B for the sake of convenience. FIGS. 3A-8B are illustrated upside down relative to the FIG. 1.

Figure 3A:
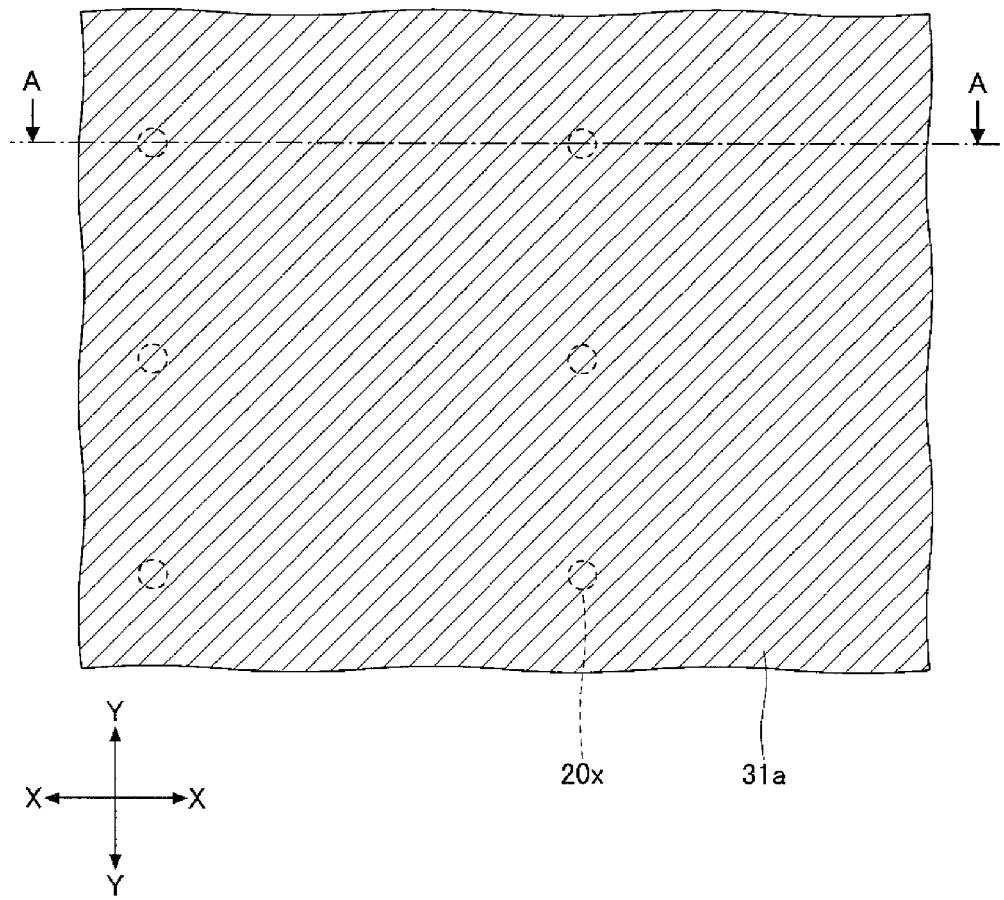
FIGS. 3A-8B are schematic diagrams for describing processes performed in a method for manufacturing a connection terminal structure according to the first embodiment of the present invention.
Figure 3B:
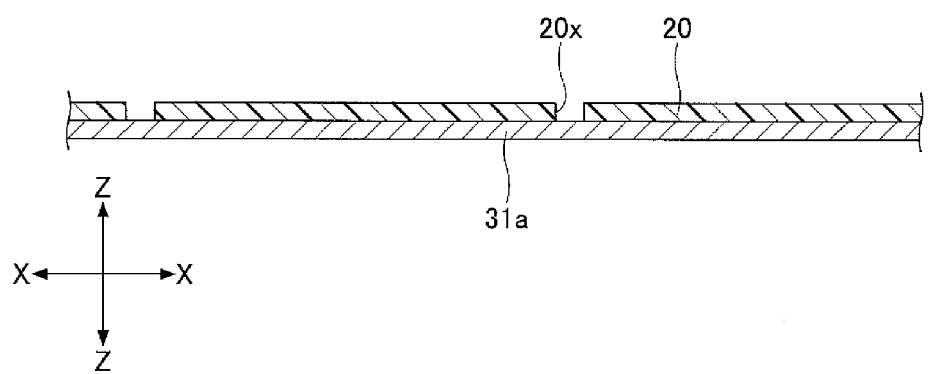

First, in the process illustrated in FIGS. 3A and 3B, a sheet-like or a tape-like member having a metal layer 31a formed on the first surface of the support member 20 is prepared. Then, the opening parts 20x are formed in a portion of the support member 20. The opening part 20x exposes a portion of the metal layer 31a which eventually becomes a pad (i.e. a part of a portion which eventually becomes the fixing part 35). The opening part 20x can be formed by, for example, laser processing. The metal layer 31a may be bonded to the first surface of the support member 20 interposed by an adhesive layer (not illustrated). Alternatively, the metal layer 31a may be bonded to the first surface of the support member 20 by pressure welding. The metal layer 31a eventually becomes the metal part 31 of each of the connection terminals 30.

For example, a film formed of an insulating resin (e.g., a polyimide type resin) may be used as the material of the support member 20. Alternatively, other insulating resins such as an aramid type resin or an epoxy type resin may be used instead of the polyimide type resin. Alternatively, a member formed by impregnating a glass cloth with an insulating resin (e.g., an epoxy type resin) may be used instead of the polyimide type resin. The thickness of the support member 20 may be, for example, approximately 25 μm to 100 μm.

For example, copper or a copper alloy (e.g., phosphor bronze, beryllium copper, Corson alloy) may be used as the material of the metal layer 31a. The thickness of the metal layer 31a may be, for example, approximately 25 m to 100 Nm. In this embodiment, a copper foil is used as the metal layer 31a.

Then, in the processes illustrated in FIGS. 4A-5B, a patterning process is performed on the metal layer 31a. Thereby, metal parts 31 and a bus line 31b (see, for example, FIG. 5A) are formed. Each of the metal parts 31 is formed into a shape including the fixing part 35, the spring part 37, and the connection part 36. The metal parts 31 are electrically connected to each other by the bus line 31b.

Figure 4A:
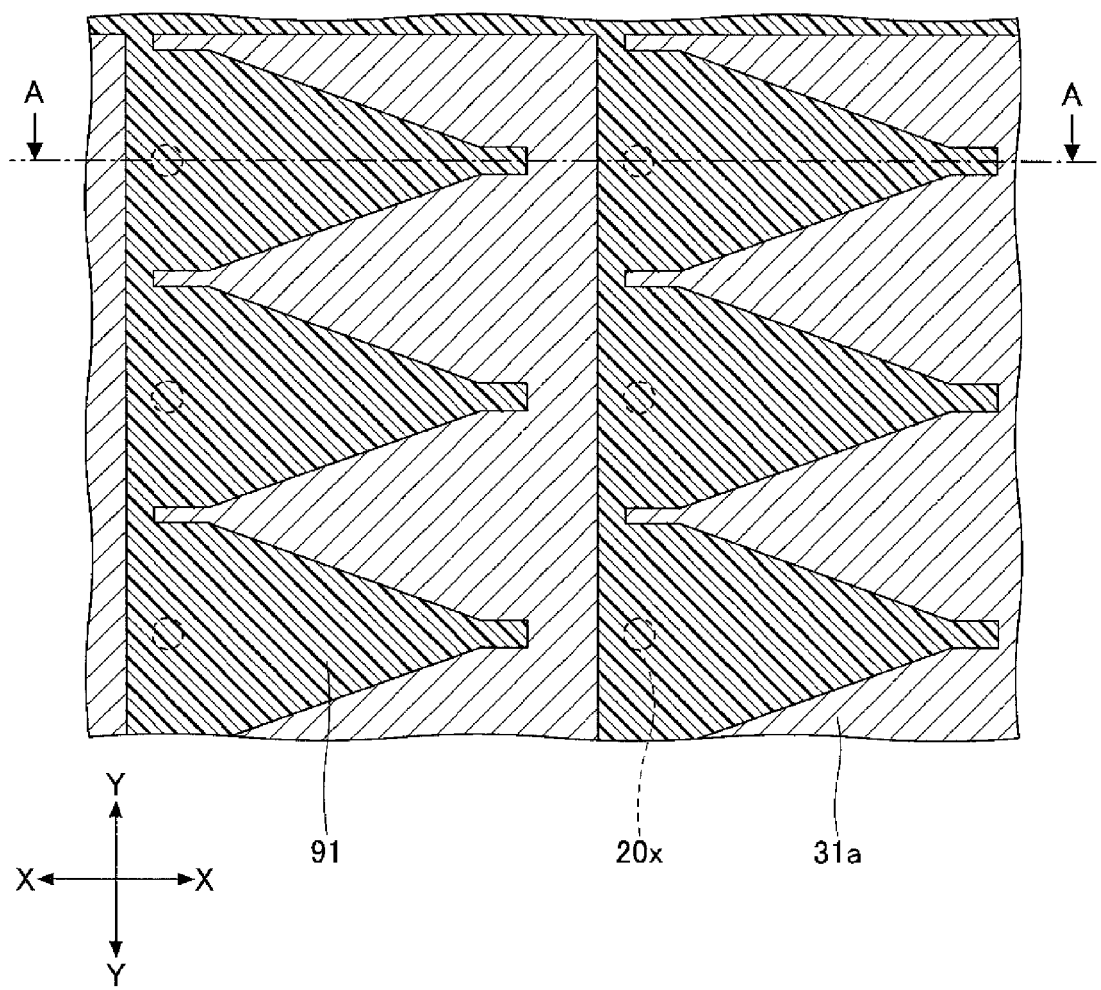
Figure 4B:
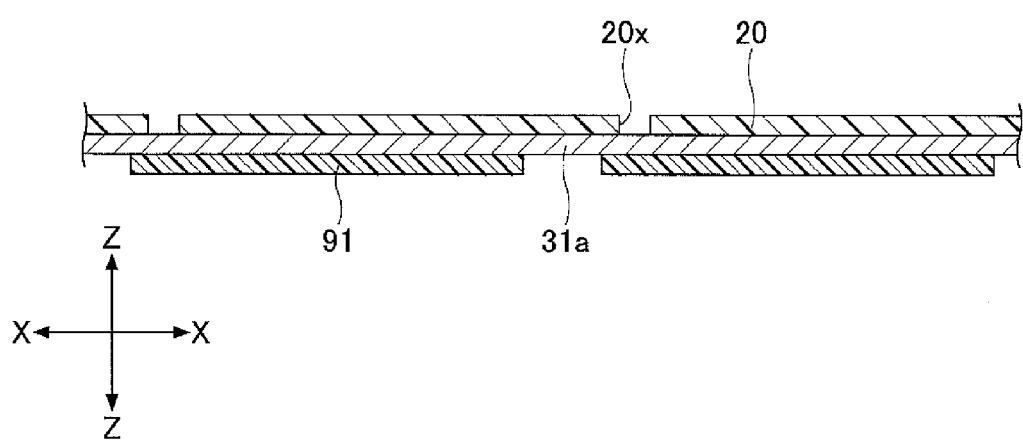

For example, in the process illustrated in FIGS. 4A and 4B, a resist layer 91 covers predetermined portions of a first surface (i.e. a surface of the metal layer 31a on the side which does not contact the support member 20). The resist layer 91 may be formed by laminating a resist film entirely on the first surface of the metal layer 31a and performing exposure and development on the resist film. Thereby, the resist layer 91 can cover the predetermined portions of the first surface of the metal layer 31a. The predetermined portions correspond to portions which eventually become the metal part 31 of each of the connection terminals 30 and the bus line 31b used for performing the below-described electroplating method.

Figure 5A:
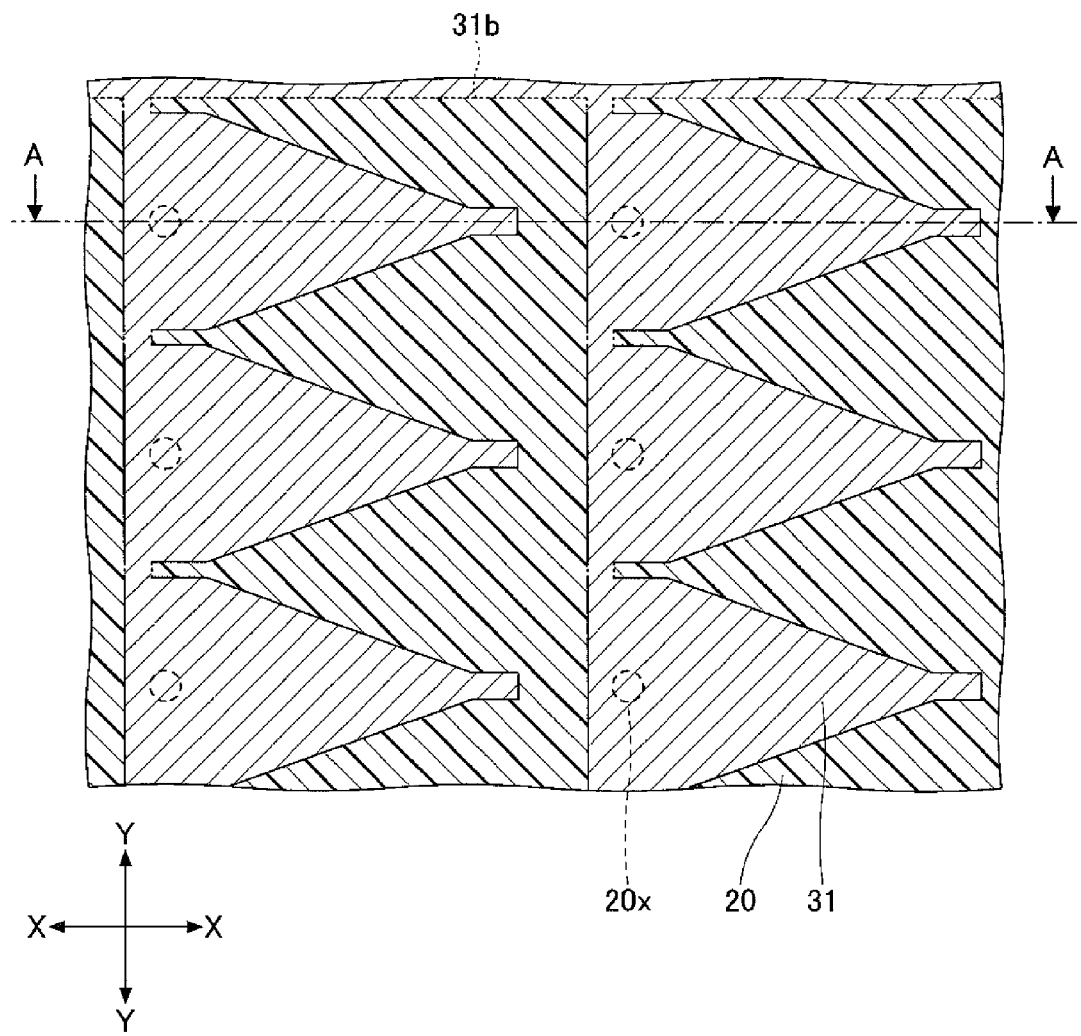
Figure 5B:
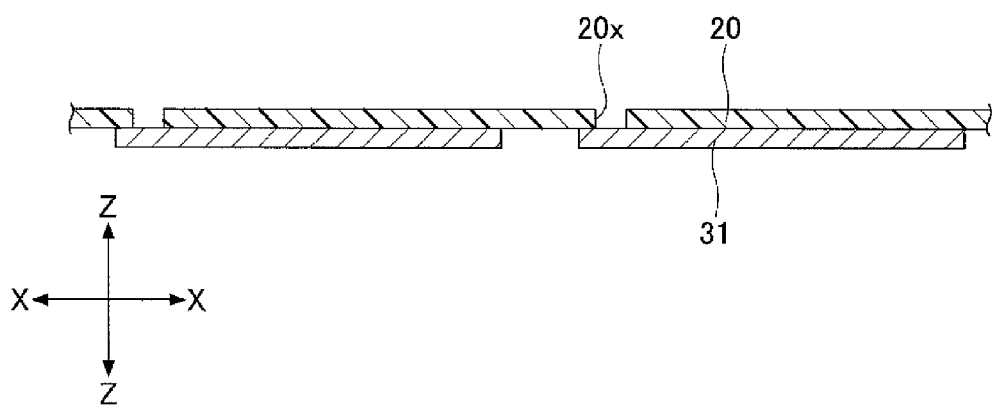

Then, in the process illustrated FIGS. 5A and 5B, portions of the metal layer 31a that are not covered by the resist layer 91 are removed by etching. Thereby, the metal part 31 and the bus line 31b are formed. In a case where copper foil is used as the material of the metal layer 31a, the portions of the metal layer 31a may be removed by wet-etching with, for example, a ferric chloride solution, a cupric chloride solution, or an ammonium persulfate. Then, the resist layer 91 is removed. Although the metal part 31 and the bus line 31b are integrally formed (i.e. form a united body), the bus line 31b is illustrated with a broken line in FIG. 5A (also FIGS. 6A and 7A) for the sake of convenience.

Figure 6A:
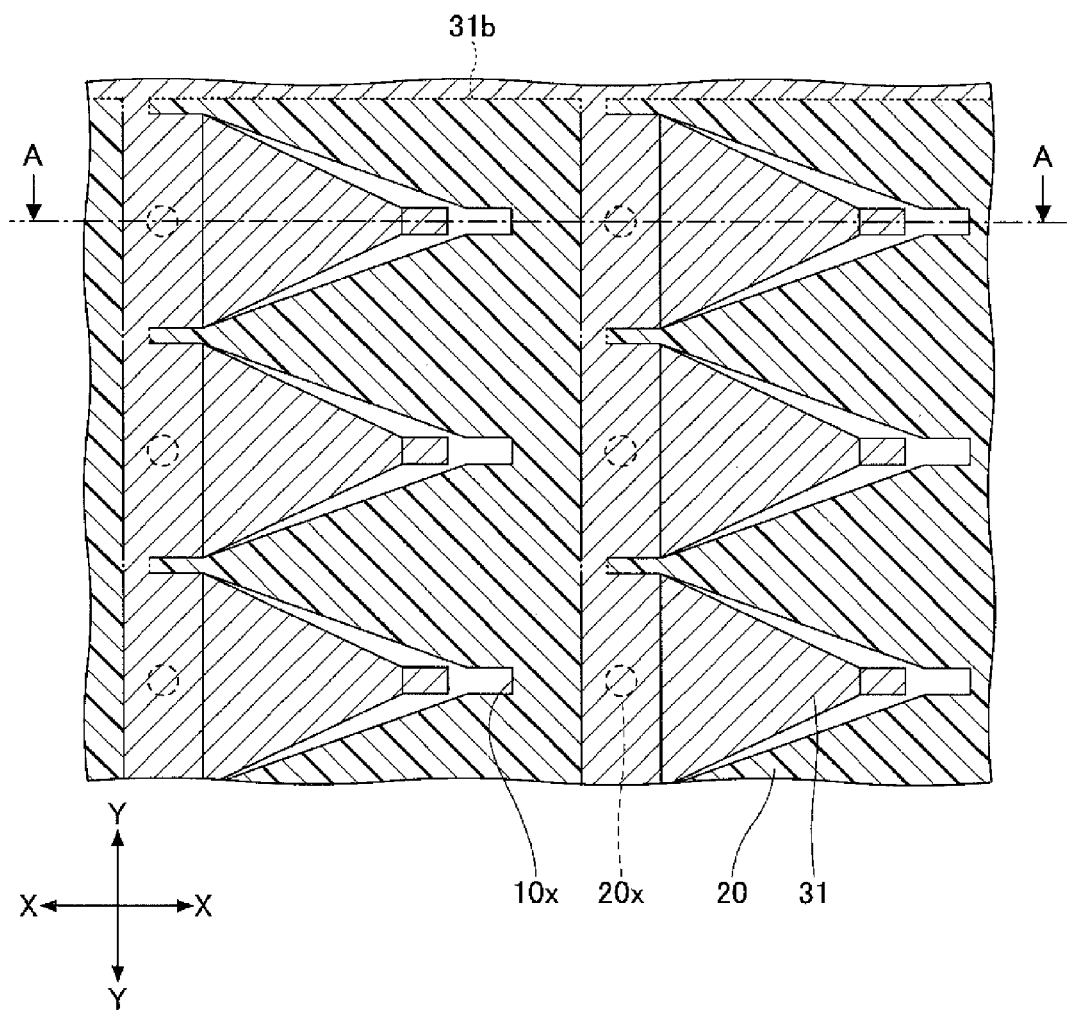
Figure 6B:
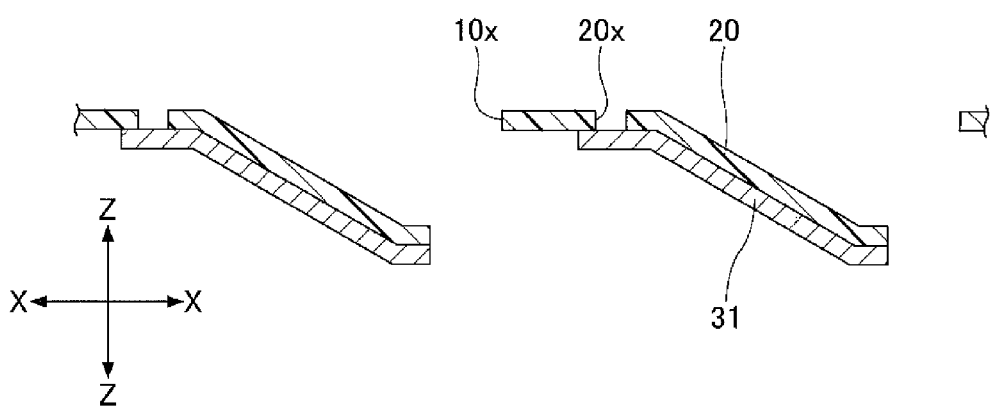

Then, in the process illustrated in FIGS. 6A and 6B, portions of the metal part 31 are cut and bent upward together with the support member 20 by using, for example, a stamping process. Thereby, the portions of the metal part 31 project in a direction of the first surface of the support member 20 (i.e. project toward the first connection object 60 as illustrated in, for example, FIG. 2). In the process illustrated in FIGS. 6A and 6B, the opening parts 10x are formed in the upward bent portions of the metal part 31.

Figure 7A:
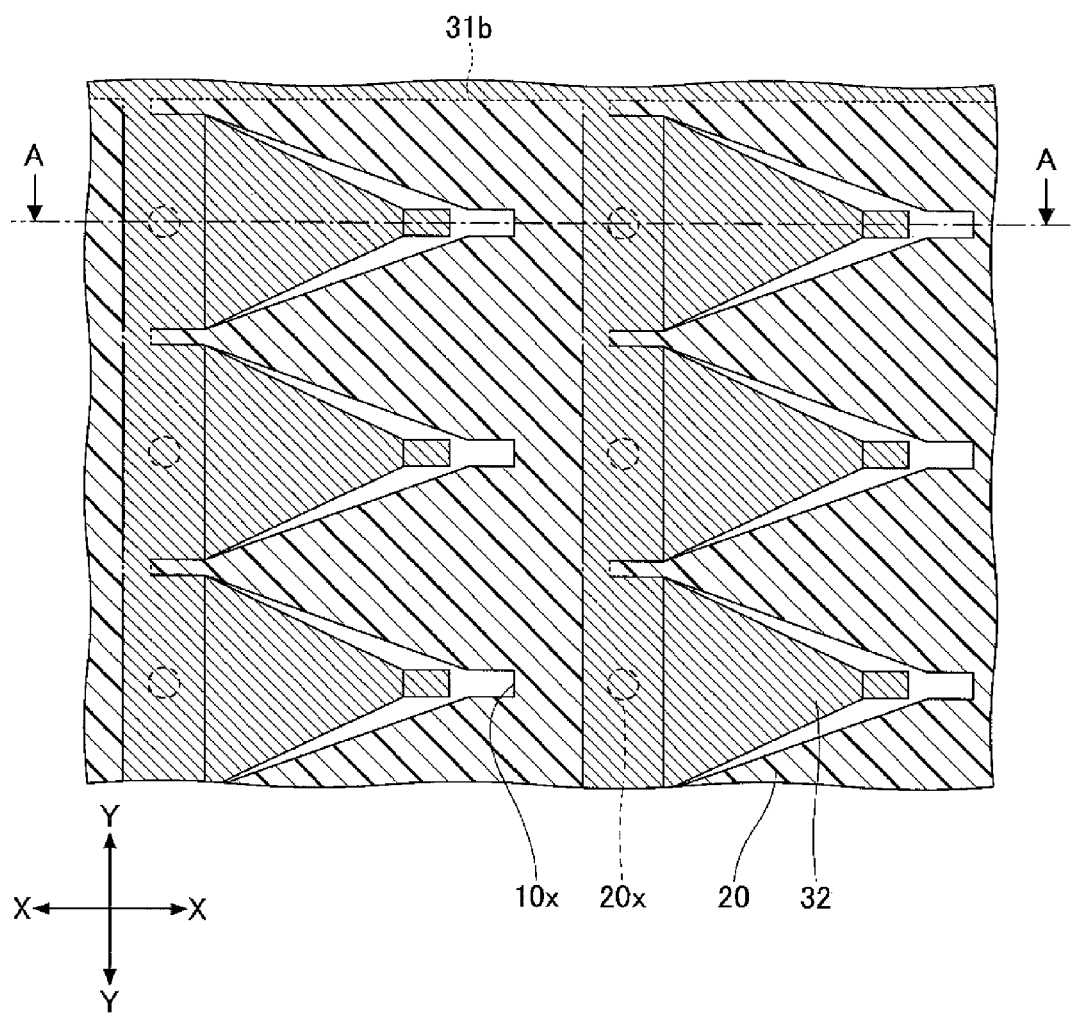
Figure 7B:
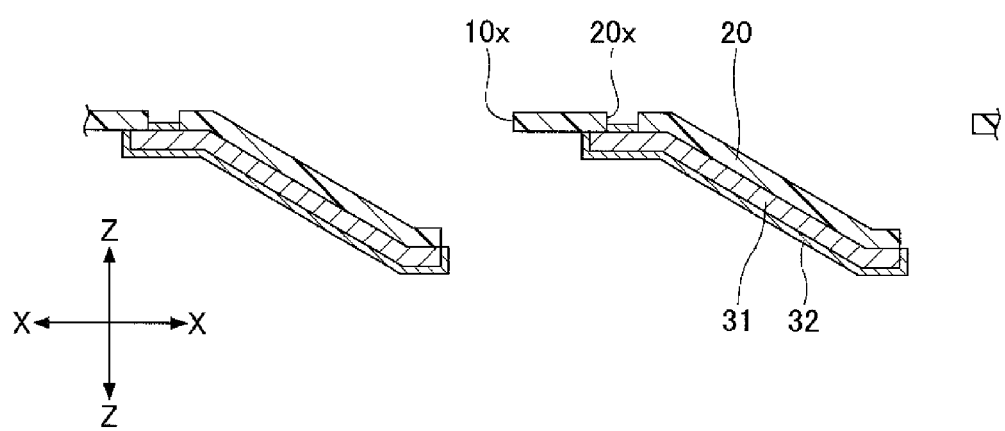

Then, in the process illustrated in FIGS. 7A and 7B, the plating part 32 is formed on the metal part 31 except for a portion that contacts the first surface of the support member 20. Thus, the plating part 32 is also formed in the opening part 20x. The plating part 32 is formed by an electroplating method in which the bus line 31b is used as a power feeding line. For example, a nickel cobalt (NiCo) alloy plating, a palladium cobalt (PdCo) alloy plating, or a nickel (Ni) plating may be used as the material of the plating part 32. In a case where a nickel cobalt (NiCo) alloy plating or a palladium cobalt (PdCo) alloy plating is used as the plating part 32, the thickness of the plating part 32 may be, for example, approximately 10 μm to 50 μm. In a case where a nickel (Ni) plating is used as the plating part 32, the thickness of the plating part 32 may be, for example, approximately μm to 100 μm.

In order to increase connection reliability relative to the pad 62 of the first connection object 60, a noble metal plating such as a gold (Au) plating or a palladium (Pd) plating may be additionally formed on the surface of the nickel cobalt (NiCo) alloy plating, the palladium cobalt (PdCo) alloy plating, or the nickel (Ni) plating of the plating part 32. The thickness of the noble metal plating (e.g., gold (Au) plating) may be, for example, approximately 0.1 μm to 0.4 μm. It is to be noted that, the noble metal plating (e.g., gold (Au) plating) may be solely formed on a portion of the plating part 32 corresponding to the connection part 36.

Figure 8A:
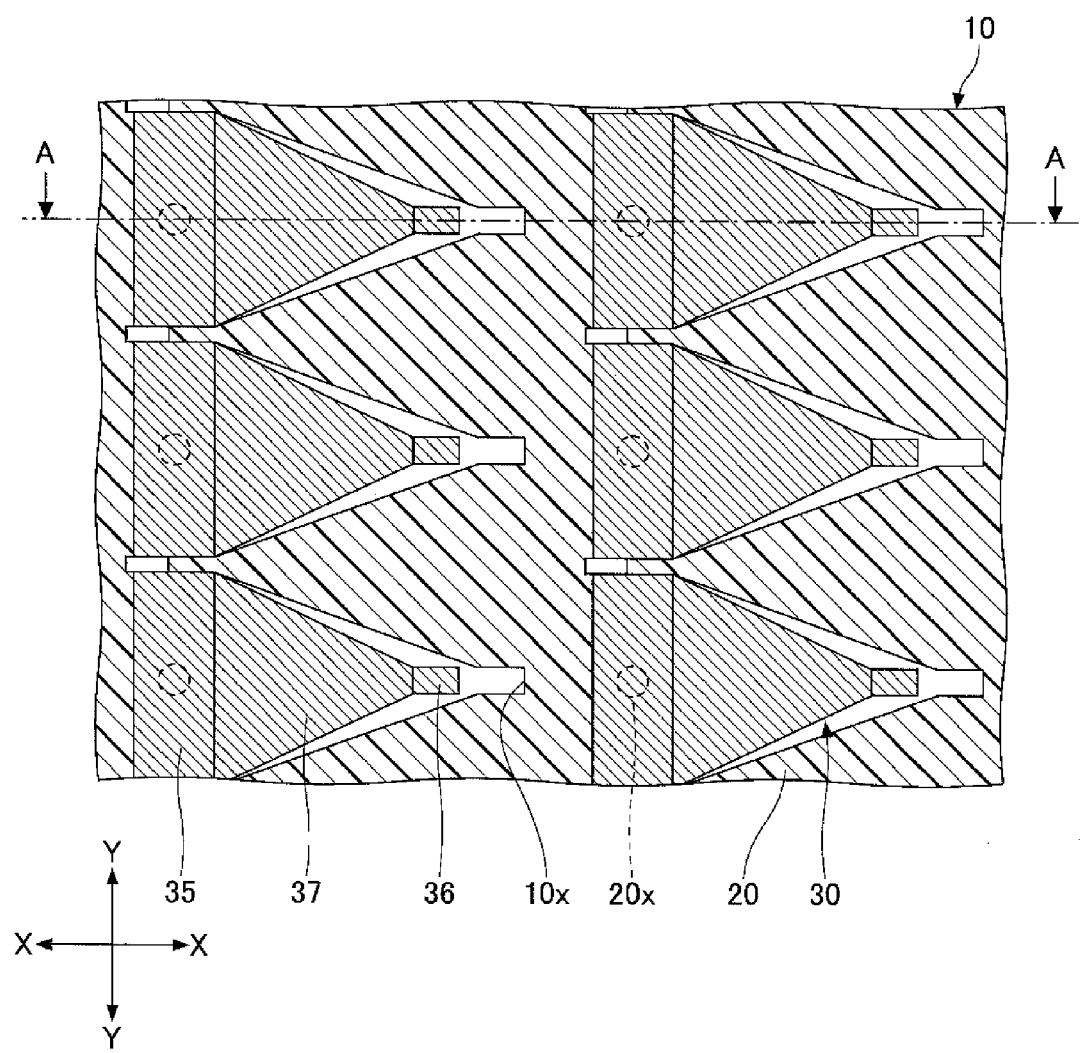
Figure 8B:
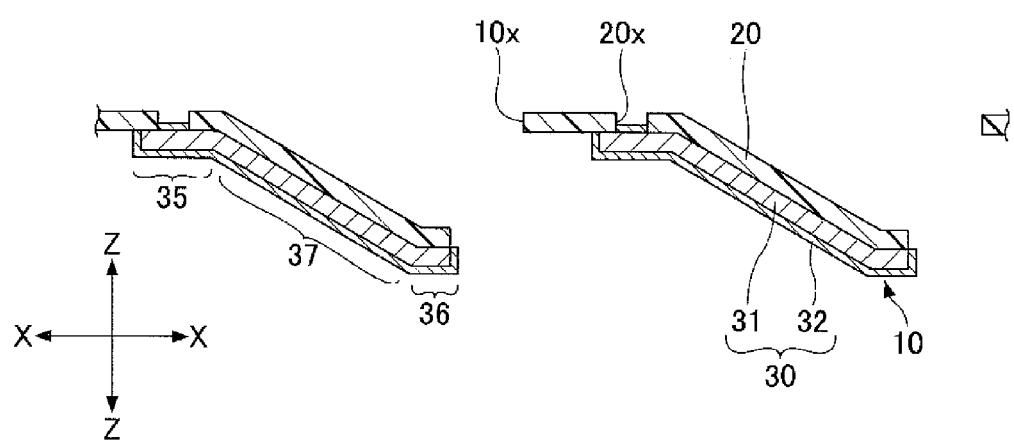

Then, in the process illustrated in FIGS. 8A and 8B, the bus line 31b illustrated in FIG. 7A is cut off from the metal part 31. The bus line 31b may be cut off by using, for example, a stamping method or a laser processing method. Because the bus line 31b is stamped together with the support member 20 in a case where the stamping method is used, a through-hole (s) is formed in a portion of the support member 20 from which the bus line 31b is removed. Thereby, the manufacturing of the connection terminal structure 10 having plural connection terminals 30 formed on the support member is completed.

According to the above-described first embodiment, the connection terminal structure 10 having plural connection terminals 30 formed on the support member 20 is formed by processing a sheet-like or a tape-like material having the metal layer 31a formed on the first surface of the support member 20. Thereby, plural connection terminals 30 can be formed in a batch. Further, with the above-described first embodiment, no complicated process such as bending a connection terminal with an intricate die is performed. Therefore, the connection terminal structure 10 can be easily manufactured.

Further, with the above-described first embodiment, in a case of using the connection terminal structure 10 as a socket of a semiconductor package, various adjustments (e.g., pitch conversion, height adjustment) can be easily performed by using the substrate 40.

Second Embodiment

Next, another example of a structure mounted substrate using the connection terminal structure 10 according to the second embodiment of the present invention is described. In the second embodiment, like components are denoted by like reference numerals as those of the first embodiment, and are not further explained.

Figure 9:
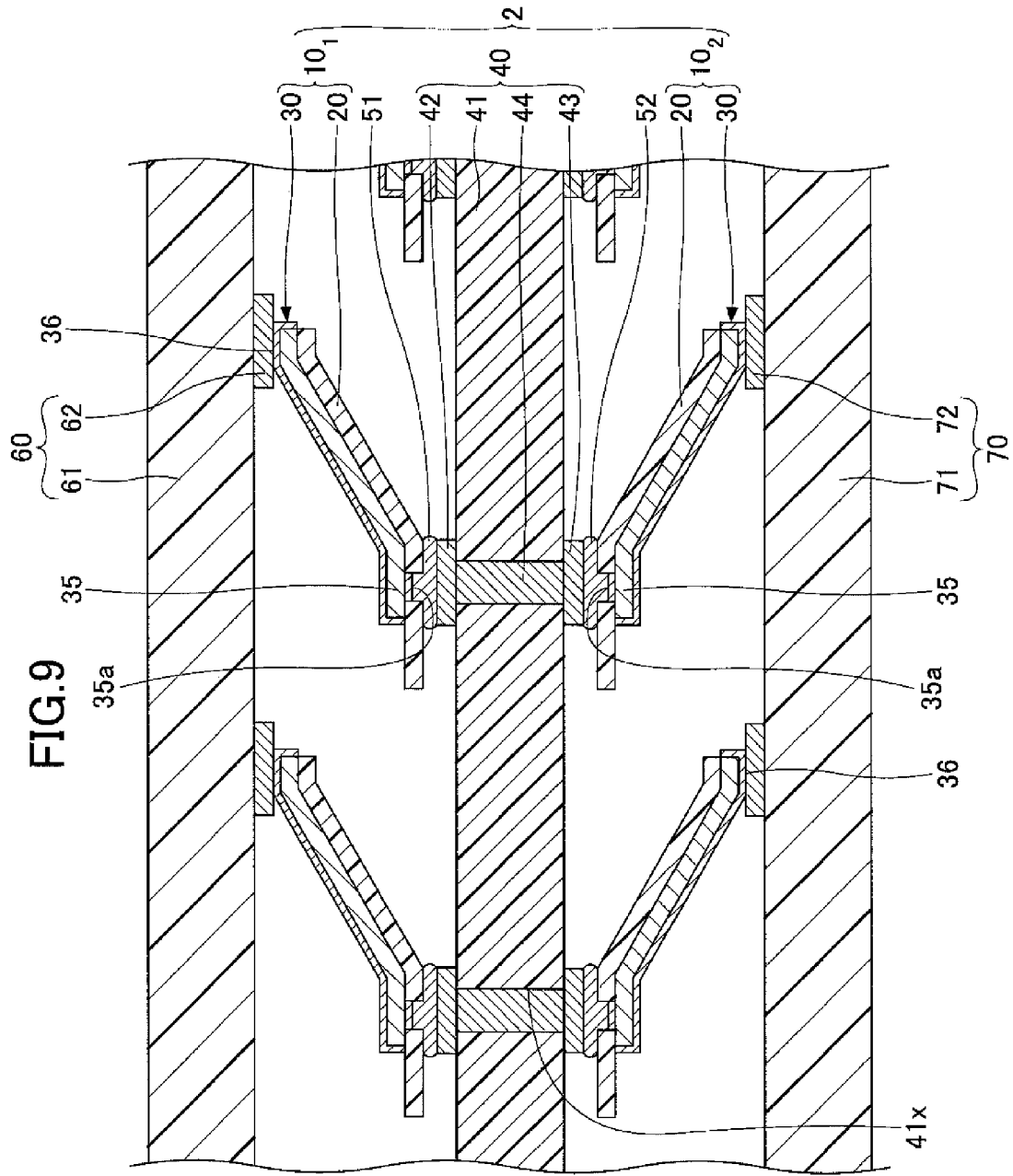
FIG. 9 is a cross-sectional view illustrating an example of a structure mounted substrate according to a second embodiment of the present invention.

FIG. 9 is a cross-sectional view illustrating an example of a structure mounted substrate 2 according to the second embodiment of the present invention. Unlike the structure mounted substrate 1 (see FIG. 2), a structure mounted substrate 2 according to the second embodiment (see FIG. 9) has the connection terminal structure 10 of FIG. 1 provided on both surfaces of the substrate 40. For the sake of convenience, the connection terminal structure provided on a surface of the substrate 40 toward the first connection object 60 is referred to as "first connection terminal structure $10_1$", and the connection terminal provided on a surface of the substrate 40 toward the second connection object 70 is referred to as "second connection terminal structure $10_2$".

In the second connection terminal structure $10_2$, the pad 35a of the connection terminal 30 is bonded to the second conductive layer 43 of the substrate 40 interposed by the bonding part 52. Thus, the pad 35a is electrically and mechanically connected to the second conductive layer 43 by way of the bonding part 52. In the second connection terminal structure $10_2$, the connection part 36 of the connection terminal 30 contacts the pad 72 of the second connection object 70 in a state separable from the pad 72 (i.e. a state not fixed to the pad 72).

The first connection object 60 and the structure mounted substrate 2, and the second connection object 70 are positioned by a frame part (not illustrated), so that the pad 62 of the first connection object 60 contacts the connection part 36 of the first connection terminal structure $10_1$, and the pad 72 of the second connection object 70 contacts the connection part 36 of the second connection terminal structure $10_2$. For example, the frame part may have a frame-like shape from a plan view. Further, the position of the first connection object 60 is fixed (locked) by a lid part (not illustrated) in a state where a pressing force is exerted toward the substrate 40 by the lid part onto the first connection object 60.

Thereby, the pressing force exerted onto the first connection object 60 is transmitted to the connection terminals 30 of the first and the second connection terminal structures $10_1$, $10_2$. The pressing force transmitted to each of the connection terminals 30 causes each of the connection terminals to contract in the Z-Z direction and generate a predetermined amount of spring force. Accordingly, the pad 62 of the first connection object 60 contacts the connection part 36 of the connection terminal structure $10_1$, and the pad 72 of the second connection object 70 contacts the connection part 36 of the connection terminal structure $10_2$.

In other words, the first connection object 60 is electrically connected to the second connection object 70 interposed by the structure mounted substrate 2. By locking and unlocking (releasing) the lid part (not illustrated), the first connection object 60 and the structure mounted substrate 2 can be detachably attached to the second connection object 70.

Accordingly, the above-described embodiment of the structure mounted substrate 2, and the frame part (not illustrated), and the lid part (not illustrated) constitute a socket. By changing the thickness of the substrate 40, the height of the socket can be easily adjusted.

Hence, in addition to attaining similar effects as those of the first embodiment, the following effects can be attained by the second embodiment. With the structure mounted substrate 2, at least, the first and second connection terminal structures $10_1$, $10_2$ are formed one on each surface of the substrate 40. Therefore, the structure mounted substrate 2 can be detachably attached to the first and the second connection objects 60, 70 without being fixed with solder or the like. Therefore, even in a case where the connection terminal 30 is damaged, the connection terminal 30 can easily be replaced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, by using the second connection object 70 as a substrate for testing a semiconductor package, testing of, for example, electric characteristics of the semiconductor package can be repeatedly performed. Further, pitch conversion may be performed by using the substrate according to the second embodiment of the present invention.

What is claimed is:

1. A connection terminal structure comprising:
    a support member including a first surface and an opening part formed in the first surface; and
    at least one connection terminal formed on the first surface, the connection terminal including
        a fixing part,
        a connection part configured to connect to a connection object, and
        a spring part communicating between the fixing part and the connection part;
    wherein a portion of the fixing part is exposed in the opening part,
    wherein the support member, the spring part, and the connection part are bent diagonally upward with respect to the exposed portion of the fixing part and project toward the connection object,
    wherein a direction in which the support member, the spring part, and the connection part project is toward the first surface of the support member,
    wherein the support member, the spring part, and the connection part form an obtuse angle with respect to the fixing part,
    wherein the support member includes a second surface on a side opposite to the first surface,
    wherein the opening part penetrates the support member from the first surface of the support member to the second surface of the support member,
    wherein the opening part is formed directly below the fixing part of the connection terminal.

2. The connection terminal structure as claimed in claim 1, wherein the connection terminal includes a plated surface.

3. The connection terminal structure as claimed in claim 1, wherein a plurality of the connection terminals are arranged on the support member.

4. The connection terminal structure as claimed in claim 1,
    wherein the fixing part is wider than the connection part,
    wherein the spring part becomes wider from a side of the connection part to a side of the fixing part.

5. The connection terminal structure as claimed in claim 1,
    wherein the connection terminal is formed of metal,
    wherein the support member is formed of an insulating film.

* * * * *